United States Patent
Katsumata (10) Patent No.: US 10,164,594 B2
(45) Date of Patent: Dec. 25, 2018

(54) HIGH-FREQUENCY SEMICONDUCTOR AMPLIFIER

(71) Applicant: Kabushiki Kaisha Toshiba, Minato-ku, Tokyo (JP)

(72) Inventor: Maomi Katsumata, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/691,788

(22) Filed: Aug. 31, 2017

(65) Prior Publication Data

US 2018/0248530 A1    Aug. 30, 2018

(30) Foreign Application Priority Data

Feb. 24, 2017 (JP) .................. 2017-033347

(51) Int. Cl.
| | |
|---|---|
| H03F 1/22 | (2006.01) |
| H03G 3/30 | (2006.01) |
| H03F 1/02 | (2006.01) |
| H03F 3/193 | (2006.01) |
| H03F 3/21 | (2006.01) |
| H01L 27/12 | (2006.01) |
| H01L 23/66 | (2006.01) |

(52) U.S. Cl.
CPC ......... *H03G 3/3042* (2013.01); *H03F 1/0211* (2013.01); *H03F 3/193* (2013.01); *H03F 3/21* (2013.01); *H01L 23/66* (2013.01); *H01L 27/1203* (2013.01); *H01L 2223/665* (2013.01); *H03F 1/223* (2013.01); *H03F 2200/294* (2013.01); *H03F 2200/451* (2013.01)

(58) Field of Classification Search
CPC ... H03F 1/22; H03F 1/223; H03F 3/04; H03F 3/195
USPC .......................... 330/285, 296, 311
See application file for complete search history.

(56) References Cited

U.S. PATENT DOCUMENTS

| | | | |
|---|---|---|---|
| 8,970,307 B2 | 3/2015 | Marra et al. | |
| 2014/0333384 A1* | 11/2014 | Gill | H03F 3/195 330/296 |
| 2016/0241203 A1 | 8/2016 | Lehtola et al. | |

FOREIGN PATENT DOCUMENTS

| | | |
|---|---|---|
| JP | 2008-306360 A | 12/2008 |
| JP | 2013-501430 A | 1/2013 |
| JP | 2016-149748 A | 8/2016 |

(Continued)

*Primary Examiner* — Steven J Mottola
(74) *Attorney, Agent, or Firm* — White & Case LLP (57) ABSTRACT

A circuit is formed on an SOI. The bias generator is connected to the gates of first and second transistors. In the bias generator, a first variable current source is connected to the power supply circuit via a power supply node. A third transistor is connected between the first variable current source and a ground-voltage source. A gate thereof is connected to the gate of the first transistor. A first operational amplifier controls a gate voltage of the third transistor so that a voltage at a second node between the first variable current source and the third transistor becomes almost equal to a reference-voltage. A first characteristics changer is connected to the gate of the third transistor or a second node, to change at least one loop gain characteristics and phase characteristics of a loop from the first operational amplifier, through the third transistor, to the first variable current source.

15 Claims, 9 Drawing Sheets

(56) References Cited

FOREIGN PATENT DOCUMENTS

JP 2018-037801 A 3/2018

\* cited by examiner

HIGH-FREQUENCY SEMICONDUCTOR AMPLIFIER

CROSS REFERENCE TO RELATED APPLICATIONS

This application is based upon and claims the benefit of priority from the prior Japanese Patent Application No. 2017-033347, filed on Feb. 24, 2017, the entire contents of which are incorporated herein by reference.

FIELD

The embodiments of the present invention relate to a high-frequency semiconductor amplifier.

BACKGROUND

Recently, it has been considered to fabricate high-frequency low-noise amplifiers with an SOI (Silicon On Insulator) CMOS process (hereinafter, an SOI process), in place of an SiGe bipolar process (hereinafter, an SiGe process). This is because the SOI process is a lower cost process than the SiGe process. Moreover, MOS transistors fabricated with the SOI process have small parasitic capacitance and hence suffer small power loss on high-frequency signals.

As one of the methods to achieve a function (gain control function) to control the gain of such a high-frequency low-noise amplifier, it is considered to vary a current supplied to the high-frequency low-noise amplifier. However, varying a supply current may cause the high-frequency low-noise amplifier to exhibit an unstable behavior, such as oscillation, ringing, etc., in part of range or the entire range of the supply current.

DETAILED DESCRIPTION

A high-frequency semiconductor amplifier according to the present embodiment is provided with an amplifier, a bias generating circuit, and a power supply circuit. The amplifier is formed on an SOI substrate, the amplifier including a first transistor connected between a ground voltage source and a first node, a gate of the first transistor connected to a high-frequency input terminal, and including a second transistor connected between the first node and a high-frequency output terminal. The bias generating circuit is formed on the SOI substrate, which is connected to the gate of the first transistor and to a gate of the second transistor. The power supply circuit is formed on the SOI substrate, which supplies a power supply voltage to the amplifier and the bias generating circuit. In the bias generating circuit, a first variable current source is supplied with the power supply voltage. A third transistor is connected between the first variable current source and the ground voltage source, a gate thereof connected to the gate of the first transistor. A first operational amplifier controls a gate voltage of the third transistor so that a voltage at a second node becomes almost equal to a reference voltage, the second node located between the first variable current source and the third transistor. A first characteristics changing circuit is connected to the gate of the third transistor or the second node, to change at least one of loop gain characteristics and phase characteristics of a loop from the first operational amplifier circuit, through the third transistor, to the first variable current source.

Embodiments will now be explained with reference to the accompanying drawings. The present invention is not limited to the embodiments.

First Embodiment

Figure 1:
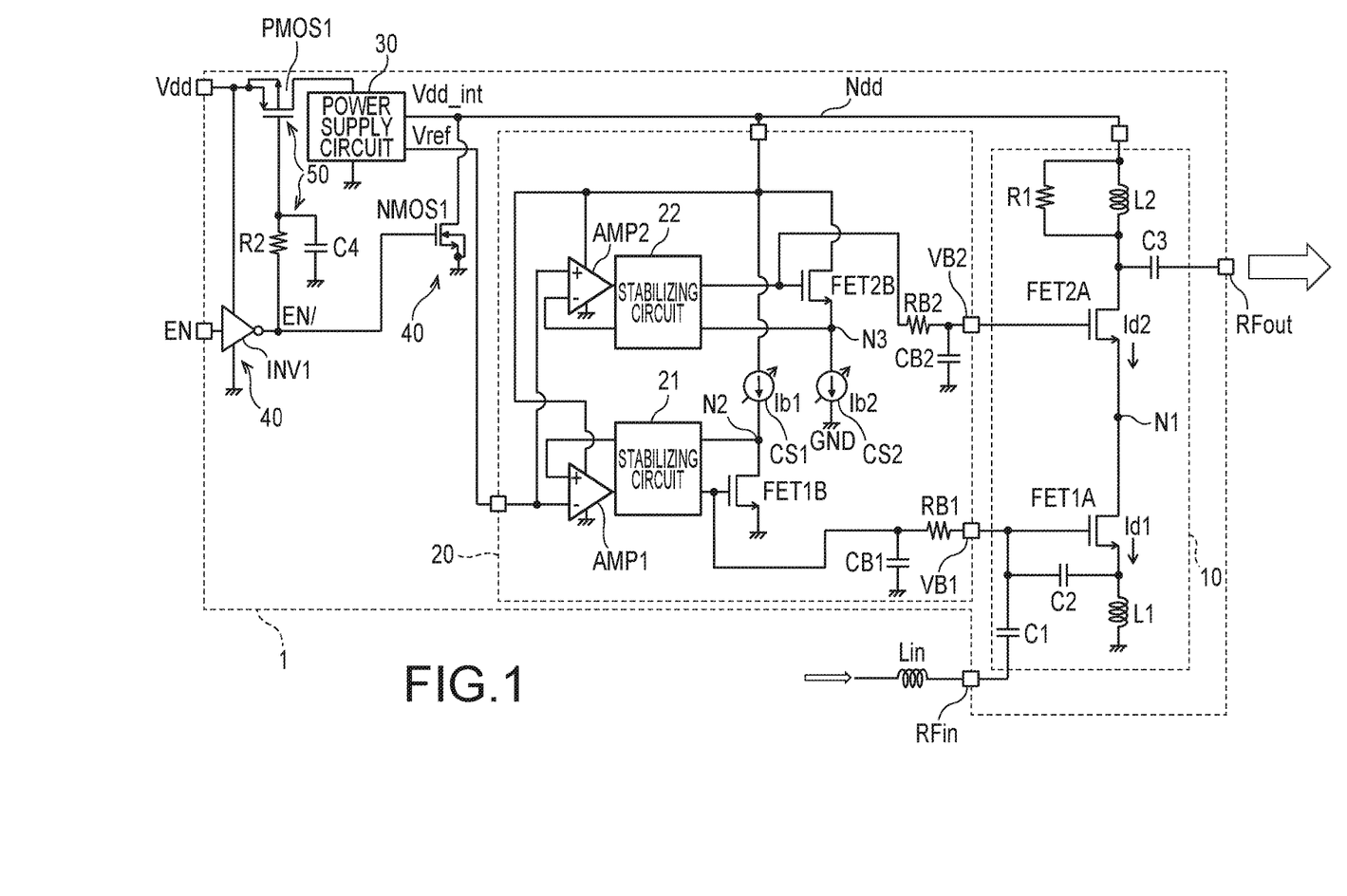
FIG. 1 is a block diagram showing an example of the configuration of a high-frequency semiconductor amplifier according to a first embodiment.

FIG. 1 is a block diagram showing an example of the configuration of a high-frequency semiconductor amplifier circuit according to a first embodiment. A high-frequency semiconductor amplifier circuit 1 of FIG. 1 may be used, for example, in a mobile phone terminal or the like, for a high-frequency power amplifier for amplifying a high frequency signal to be transmitted from an antenna and a high-frequency low-noise amplifier (LNA) for amplifying a weak high frequency signal received by the antenna. The amplifiers may be connected to a high frequency switch or the like. In the present embodiment, a high-frequency LNA1 will be explained as an example of the high-frequency semiconductor amplifier circuit 1.

The high-frequency LNA1 of FIG. 1 is fabricated on a common SOI substrate with the CMOS process. Accordingly, the high-frequency LNA1 can be fabricated at a lower cost than with the SiGe process. Moreover, a high frequency switch and the high-frequency LNA can be fabricated on the same SOI substrate. The high-frequency LNA1 of FIG. 1 is provided with a cascode amplifier circuit 10, a bias generating circuit 20, and a power supply circuit 30.

The cascode amplifier circuit 10 has an N-type transistor FET1A (first transistor), an N-type transistor (second transistor) FET2A, an inductors L1 and L2, a resistor R1, and capacitors C1, C2 and C3. The FET1A and the FET2A are connected in cascode.

In this specification, an N-type or a P-type MOS transistor is expressed as an FET, an NMOS or a PMOS. However, these devices are transistors fabricated with the CMOS process, with no substantial differences in structure, although there are differences in gate length, gate oxide film thickness, etc.

A source of the FET1A is grounded via the inductor Li, so that the FET1A is a common source amplifier circuit. A drain of the FET1A is connected to a first node N1 and, via the first node N1, connected to a source of the FET2A. A gate of the FET1A is connected to the bias generating circuit 20, so that a bias voltage VB1 generated by the bias generating circuit 20 is supplied thereto. Moreover, the gate of the FET1A is connected to an input terminal RFin at which a high-frequency input signal is input via the capacitor Ci and an external inductor Lin. The capacitor C1 is connected between the gate of the FET1A and the input terminal RFin, for removing a direct current component of the high-frequency input signal. The capacitor C2 is connected between the gate and source of the FET1A. The inductor Lin, capacitor C2 and inductor L1 are provided for input impedance matching, noise matching, etc.

A source of the FET2A is connected to the first node N1 and, via the first node N1, connected to the drain of the FET1A. A drain of the FET2A is connected, via the capacitor C3, to an output terminal RFout at which a high-frequency output signal, obtained by amplifying the high-frequency input signal, is output. To a drain of the FET2A, an internal power-supply voltage Vdd_int from the power supply circuit 30 is supplied via the parallel-connected resistor R1 and inductor L2. A gate of the FET2A is connected to the bias generating circuit 20. Supplied to the gate of the FET2A is a bias voltage VB2 generated by the bias generating circuit 20. The resistor R1 is provided for stabilization. The inductor L2 and capacitor C3 are provided for impedance characteristics adjustments at the output terminal RFout. The inductor L2 and capacitor C3 constitute an output matching circuit.

The bias generating circuit 20 uses a reference voltage Vref and the internal power-supply voltage Vdd_int both from the power supply circuit 30 to generate the bias voltages VB1 and VB2, and supplies the bias voltages VB1 and VB2 to the cascade amplifier circuit 10. In order for this, the bias generating circuit 20 is provided with a first variable current source CS1, a second variable current source CS2, an N-type transistor (third transistor) FET1B, an N-type transistor (fourth transistor) FET2B, a first operational amplifier circuit AMP1, a second operational amplifier circuit AMP2, a first stabilizing circuit 21, a second stabilizing circuit 22, capacitors CB1 and CB2, and resistors RB1 and RB2.

The first variable current source CS1 is connected to the power supply circuit 30 via a power supply node Ndd. To the first variable current source CS1, the internal power-supply voltage Vdd_int generated by the power supply circuit 30 is supplied when an enable signal EN is logic high. The first variable current source CS1 feeds a current Ib1 to the FET1B from the power supply node Ndd. Although capable of varying (switching) the current Ib1, once the first variable current source CS1 sets the current Ib1 to a certain value, it feeds the current Ib1 as a constant current.

The second variable current source CS2 is connected to a ground GND that is a ground voltage source. When the enable signal EN is logic high, the second variable current source CS2 feeds (pulls) a current Ib2 from the FET2B to the power supply node Ndd. Although capable of varying (switching) the current Ib2, once the second variable current source CS2 sets the current Ib2 to a certain value, it feeds the current Ib2 as a constant current.

The first and second variable current sources CS1 and CS2 halt generation of the currents Ib1 and Ib2, respectively, when the enable signal EN is low. The first and second variable current sources CS1 and CS2 are, for example, a variable proportional-to-absolute temperature (PTAT) current source. The PTAT current source increases a supply current as the temperature increases. On the contrary, transconductance (gm) of the FET1A is lowered as the temperature increases. Therefore, when the temperature increases, the first and second variable current sources CS1 and CS2 increase the supply currents to compensate for lowered FET1A's transconductance (gm). Within a current adjustment range of the first and second variable current sources CS1 and CS2, the maximum current value Imax may be two times or more the minimum current value Imin. In general, when the maximum current value Imax is two times or more the minimum current value Imin, the bias voltages VB1 and VB2 may become unstable somewhere in the current adjustment range. However, it is a feature of the bias generating circuit 20 according to the present embodiment that, even if the maximum current value Imax is two times or more the minimum current value Imin, the bias voltages VB1 and VB2 can be stably supplied in the entire current adjustment range, by means of the stabilizing circuits 21 and 22 which will be described later.

The first and second variable current sources CS1 and CS2 vary the currents Ib1 and Ib2, respectively, to set the currents Ib1 and Ib2 to appropriate current values depending on variation in production of the high-frequency LNA 1. The currents Ibi and Ib2 may be set to a certain value in trial production and fixed in mass production. Moreover, the currents Ib1 and Ib2 may be set to a certain value per device, wafer, lot, or production line in mass production.

The FET1B is connected between the first variable current source CS1 and the ground GND. In detail, a source of the FET1B is connected to the ground GND and a drain thereof is connected to the first variable current source CS1. A gate of the FET1B is connected to the output of the operational amplifier circuit AMP1 via the stabilizing circuit 21 and connected to the gate of the FET1A via the resistor RB1. The gates of the FET1B and FET1A are connected in a common-gate structure, so that the FET1B and FET1A constitute a current mirror circuit. The FET1B is under control by the operational amplifier circuit AMP1, to feed the current Ib1 from the first variable current source CS1, a gate voltage of the FET1B being generated as the bias voltage VB1 applied to the gate of the FET1A. A drain current Id1 of the FET1A is decided in accordance with the bias voltage VB1. For example, when the FET1A's size (that is, gate width/gate length) is n times (n being a positive integer) the FET1B's size, the FET1A can feed a current n times the current of the FET1B. Therefore, Id1 becomes almost equal to n×Ib1. As described above, the FET1B functions as a replica of the FET1A. The transistor size is a ratio (W/L) of a gate width W to a gate length L of a transistor.

A non-inverting input of the first operational amplifier circuit AMP1 is connected to a second node N2 located between the first variable current source CS1 and the drain of the FET1B via the first stabilizing circuit 21. An inverting input of the first operational amplifier circuit AMP1 is connected to the power supply circuit 30 via the first stabilizing circuit 21. The output of the AMP1 is connected to the gate of the FET1B via the first stabilizing circuit 21. The AMP1 controls a gate voltage (bias voltage VB1) of the FET1B so that a drain voltage (voltage at the second node N2) of the FET1B, which is generated when the FET1B feeds the current Ib1, becomes almost equal to the reference voltage Vref supplied from the power supply circuit 30, as an input.

The first stabilizing circuit 21, which is a first characteristics changing circuit, is connected between the AMP1 and the gate or drain (second node N2) of the FET1B. The first stabilizing circuit 21 changes at least one of the loop gain characteristics or phase characteristics of a loop from the AM P1, through the FET1B, to the first variable current source CS1. The internal configuration of the stabilizing circuit 21 will be described later.

The capacitor CB1 and the resistor RB1 constitute a filter circuit, provided between the gates of the FET1A and FET1B. The capacitor CB1 and the resistor RB1 restrict contamination of a high-frequency signal from the cascade amplifier circuit 10 into the bias generating circuit 20.

The FET2B is connected between the power supply circuit 30 and the second variable current source CS2. In detail, a source of the FET2B is connected to the second variable current source CS2, a drain thereof being connected to the power supply circuit 30. A gate of the FET2B is connected to the output of the operational amplifier circuit AMP2 via the stabilizing circuit 22 and connected to the gate of the FET2A via the resistor RB2. The gates of the FET2B and FET2A are connected in a common-gate structure. The FET2B feeds the current Ib via the second variable current source CS2 under control by the operational amplifier circuit AMP2, a gate voltage of the FET2B being generated as the bias voltage VB2 applied to the gate of the FET2A. A drain current Id2 of the FET2A becomes equal to the current Id1 decided by the FET1A (Id2=Id1), so that a gate-to-source voltage Vgs2A is generated in accordance with the drain current Id2. For example, when the FET2A's size (that is, gate width/gate length) is n times (n being a positive integer) the FET2B's size, the gate-to-source voltage Vgs2A and a gate-to-source voltage Vgs2B become equal to each other by feeding a current n times the current of the FET2B to the FET2A. Therefore, Id2 becomes almost equal to n×Ib2, so that Vgs2A becomes equal to Vgs2B, and hence a drain voltage (voltage at the first node N1) of the FET1A becomes equal to the reference voltage Vref. As described above, the FET2B functions as a replica of the FET2A.

A non-inverting input of the second operational amplifier circuit AMP2 is connected to the reference voltage output Vref of the power supply circuit 30 via the second stabilizing circuit 22. An inverting input of the second operational amplifier circuit AMP2 is connected to a third node N3 located between the second variable current source CS2 and the source of the FET2B via the second stabilizing circuit 22. The output of the AMP2 is connected to the gate of the FET2B via the second stabilizing circuit 22.

The AMP2 controls a gate voltage (bias voltage VB2) of the FET2B so that a source voltage (voltage at the third node N3) of the FET2B, which is generated when the FET2B feeds the current Ib2, becomes almost equal to the reference voltage Vref supplied from the power supply circuit 30, as an input.

The second stabilizing circuit 22, which is a second characteristics changing circuit, is connected between the AMP2 and the gate or source (third node N3) of the FET2B. The second stabilizing circuit 22 changes at least one of the loop gain characteristics and phase characteristics of a loop from the AMP2, through the FET2B, to the second variable current source CS2. The internal configuration of the stabilizing circuit 22 will be described later.

The capacitor CB2 and the resistor RB2 constitute a filter circuit, provided between the gates of the FET2A and FET2B. The capacitor CB2 and the resistor RB2 restrict contamination of a high-frequency signal from the cascode amplifier circuit 10 into the bias generating circuit 20.

Each body (back gate) of the FET1A, FET2A, FET1B and FET2B is in a floating state electronically, which minimizes the effect of FET's parasitic capacitance viewed from the ground voltage side, as much as possible, restricting the loss of a high-frequency signal.

The power supply circuit 30 generates the internal power-supply voltage Vdd_int and the reference voltage Vref from an external power-supply voltage Vdd and supplies power source voltage and reference voltage to the cascode amplifier circuit 10 and the bias generating circuit 20 via a power supply node Ndd.

The enable control circuit 40 has an inverter INV1 and an N-type transistor NMOS1. The inverter INV1 outputs a logic low when the enable signal EN becomes logic high, to turn off the NMOS1. Conversely, the NMOS1 is turned on when the enable signal EN is logic low. An output voltage (voltage at the power supply node Ndd) of the power supply circuit 30 is turned to be the ground voltage (0V) when the NMOS1 is turned on and turned to be the internal power-supply voltage Vdd_int or Vref generated by the power supply circuit 30 when the NMOS1 is turned off.

The soft start circuit 50 has a P-type transistor PMOS1, a resistor R2, and a capacitor C4. To a gate of the PMOS1, the resistor R2 and the capacitor C4 are each connected at one end thereof. The resistor R2 is connected at the other end thereof to an output node of the inverter INV1. The capacitor C4 is connected at the other end thereof to the ground GND. To a source of the PMOS1, the external power-supply voltage Vdd is input, a drain thereof being connected to the power supply circuit 30. When the enable signal EN is turned to be logic high from logic low, and if the PMOS1 is turned on rapidly, drain-to-source voltages Vds1 and Vds2 of the FET1A and FET2A, respectively, increase suddenly. For this reason, in the soft start circuit 50, the resistor R2 and capacitor C4 connected to the gate of the PMOS1 dull a falling waveform at the gate terminal of the PMOS1. Accordingly, the resistor R2 and capacitor C4 connected to the gate of the PMOS1 restrict rapid increase in the drain-to-source voltages Vds1 and Vds2 of the FET1A and FET2A, respectively, in a transient response period immediately after that the enable signal EN is turned to be an enable state.

Figure 2:
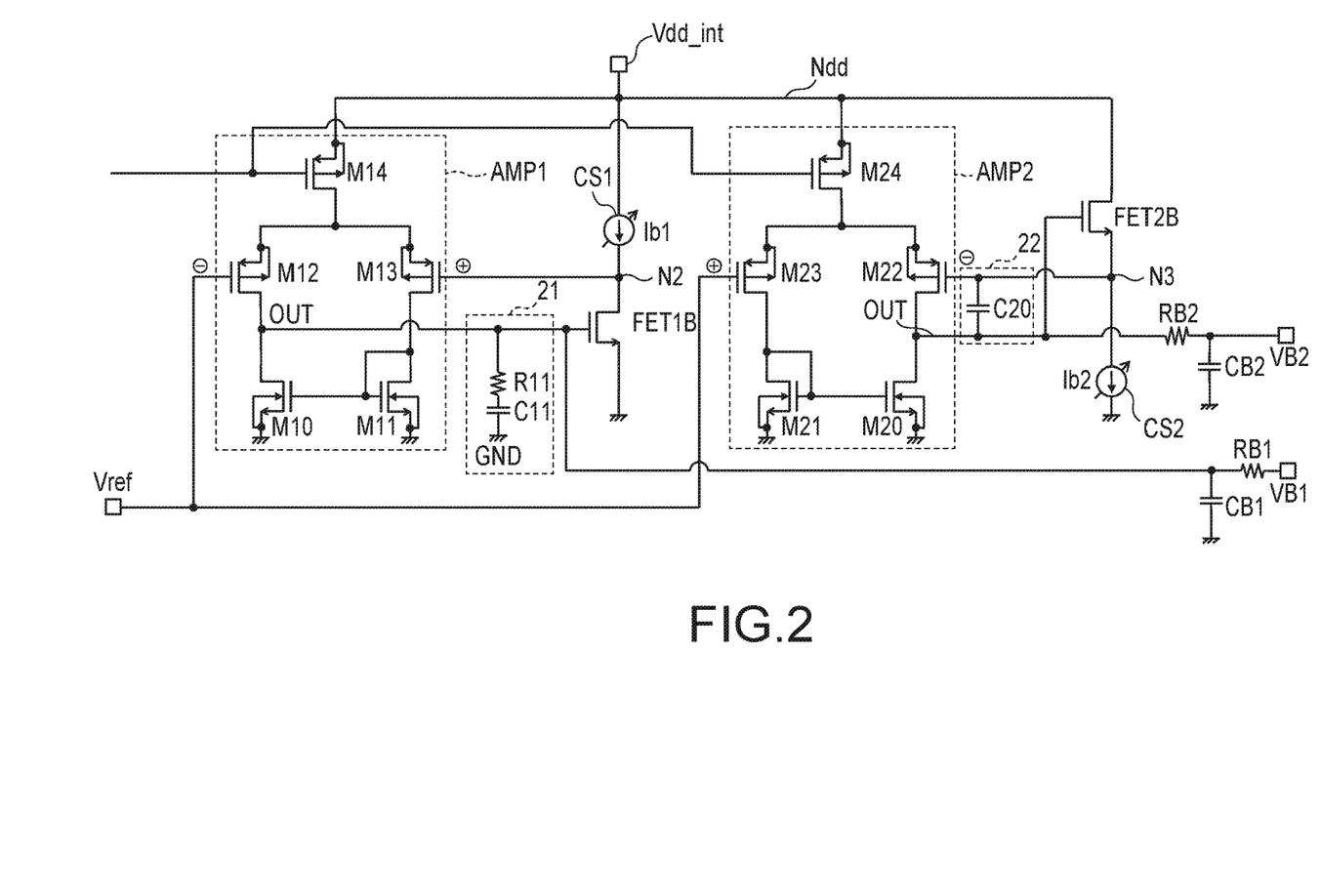
FIG. 2 is a circuit diagram showing an example of the configuration of AMP1, AMP2, and stabilizing circuits 21 and 22.

FIG. 2 is a circuit diagram showing an example of the configuration of the AMP1, AMP2, and the stabilizing circuits 21 and 22. The AMP1 is provided with NMOS transistors M10 and M11 (hereinafter, also referred to as simply M10 and M11) and PMOS transistors M12 to M14 (hereinafter, also referred to as simply M12 to M14). Gates of the M10 and M11 are both connected to a drain of the M11, so that the M10 and M11 constitute a current mirror circuit. Sources of the M10 and M11 are both connected to the ground GND, drains thereof being connected to drains of the M12 and M13, respectively. The M12 is connected between the drain of the M10 and a drain of the M14. The M13 is connected between the drains of the M11 and M14.

A gate of the M12 functions as an inverting input terminal to receive the reference voltage Vref from the power supply circuit 30. A gate of the M13 is connected to the drain (the second node N2) of the FET1B, to function as a non-inverting input terminal. Input to the M14 is the internal power-supply voltage Vdd_int from the power supply circuit 30. With this input, the M14 feeds currents to the M10 to M13. The M14 is turned on when the enable signal EN becomes logic high. A node between the M10 and M12 is connected to the gate of the FET1B, as an output of the AMP1. Having this connection, the AMP1 controls the gate voltage (the bias voltage VB1) of the FET1B so that a voltage at the second node N2, which is generated when the FET1B feeds the current Ib1, becomes almost equal to the reference voltage Vref.

The first stabilizing circuit 21 is provided with a first capacitor C11 and a first resistor R11 which are connected in series between the gate of the FET1B and the ground GND. Having this configuration, the first stabilizing circuit 21 changes at least one of the loop gain characteristics and phase characteristics of a loop from the AMP1, through the FET1B, to the first variable current source CS1.

The AMP2 is provided with NMOS transistors M20 and M21 (hereinafter, also referred to as simply M20 and M21) and PMOS transistors M22 to M24 (hereinafter, also referred to as simply M22 to M24). Gates of the M20 and M21 are both connected to a drain of the M21, so that the M20 and M21 constitute a current mirror circuit. Sources of the M20 and M21 are both connected to the ground GND, drains thereof being connected to drains of the M22 and M23, respectively. The M22 is connected between the drain of the M20 and a drain of the M24. The M23 is connected between the drains of the M21 and M24.

A gate of the M23 functions as a non-inverting input terminal to receive the reference voltage Vref. A gate of the M22 is connected to the source (the third node N3) of the FET2B, to function as an inverting input terminal. Input to the M24 is the internal power-supply voltage Vdd_int from the power supply circuit 30. With this input, the M24 feeds currents to the M20 to M23. The M24 is turned on when the enable signal EN becomes logic high. A node between the M20 and M22 is connected to the gate of the FET2B, as an output of the AMP2. Having this connection, the AMP2 controls the gate voltage (the bias voltage VB2) of the FET2B so that a voltage at the third node N3, which is generated when the FET2B feeds the current Ib2, becomes almost equal to the reference voltage Vref.

The second stabilizing circuit 22 is provided with a second capacitor C20 connected in series between the gate of the FET2B and the third node N3. Having this configuration, the second stabilizing circuit 22 changes at least one of the loop gain characteristics and phase characteristics of a loop from the AMP2, through the FET2B, to the second variable current source C52.

As described above, when the currents Ib1 and Ib2 are variable, oscillation or ringing tends to occur in part of range or the entire range of the supply current. However, the bias generating circuit 20 according to the present embodiment can supply stable bias voltages VB1 and VB2 to the cascode amplifier circuit 10 with almost no occurrence of an unstable operation or malfunction such as oscillation or ringing even with the variable currents Ib1 and Ib2, by means of the first and second stabilizing circuits 21 and 22. Accordingly, the high-frequency LNA 1 is a stable high-frequency amplifier circuit with almost no occurrence of oscillation even though the currents Ib1 and Ib2 are varied in a wide range. This effect will be explained later with reference to FIGS. 3 and 4.

Each body (back gate) of the M10 to M14 and M20 to M24 is connected to each source thereof.

Subsequently, referring again to FIG. 1, the operation of the high-frequency LNA 1 according to the present embodiment will be explained.

When the enable signal EN becomes logic high, the NMOS1 electrically isolates the power supply node Ndd from the ground GND while the PMOS1 connects the power supply voltage Vdd to the power supply circuit 30. Accordingly, the power supply circuit 30 outputs the internal power-supply voltage Vdd_int and the reference voltage Vref. The internal power-supply voltage Vdd_int is supplied to the bias generating circuit 20 and the cascode amplifier circuit 10. The reference voltage Vref is supplied to the bias generating circuit 20.

The FET1B and FET1A constitute a current mirror circuit having a mirror ratio of 1:n, so that a current n times the current flowing through the FET1B flows through the FET1A.

The AMP1's feed-back control makes a voltage at the second node N2 almost equal to the reference voltage Vref, so that the FET1B's drain-to-source voltage Vds1B becomes almost equal to the reference voltage Vref.

In the feed-back control, when the first variable current source CS1 feeds the current Ib1, the AMP1 generates the FET1B's gate-to-source voltage Vgs1B so as to keep Vds1B=Vref. The gate-to-source voltage Vgs1B becomes the bias voltage VB1.

Since the FET1A and FET1B constitute a current mirror circuit, if the FET1A's drain-to-source voltage Vds1A becomes equal to the reference voltage Vref, the FET1A can feed the current Id1 (Id1=n×Ib1) accurately. For example, a high-frequency LNA fabricated on an SOI substrate tends to surfer from a kink phenomenon due to an electronically floating state of the FET1A's back gate. Therefore, the FET1A's current largely depends on the drain voltage (voltage at the first node N1). A correct current mirror ratio requires that the FET1A's drain-to-source voltage Vds1A (voltage at the first node N1) becomes equal to the FET1B's gate-to-source voltage Vgs1B, or the reference voltage Vref. It is required to provide the FET2B and FET2A to accurately set the voltage at the first node N1 to the reference voltage Vref.

The FET2B and FET2A have a mirror ratio of 1:n, so that a current n times the current flowing through the FET2B flows through the FET2A. The AMP2's feed-back control makes a voltage at the third node N3 almost equal to the reference voltage Vref, so that the FET2B's source voltage Vs2B becomes almost equal to the reference voltage Vref.

In the feed-back control, when the second variable current source CS2 feeds the current Ib2 (Ib2=Ib1) which is accurately set to be equal to the current Ib1, the AMP2 generates the FET2B's gate-to-source voltage Vgs2B so as to keep Vs2B=Vref. The gate-to-source voltage Vgs2B becomes the bias voltage VB2.

The gates of the FET2A and FET2B are connected in a common-gate structure, so that a current Id2 (Id2=Id1=n× Ib1=n×Ib2) flows through the FET2A. This makes the FET2A's gate-to-source voltage Vgs2A almost equal to the FET2B's gate-to-source voltage Vgs2B. Moreover, the voltage at the third node N3, or the FET2B's source voltage Vs2B, is almost equal to the reference voltage Vref. Therefore, the FET2A's source voltage Vs2A becomes almost equal to the reference voltage Vref, together with the FET2B's source voltage Vs2B. In this way, the FET2A and FET2B set the voltage at the first node N1 to be equal to the reference voltage Vref.

As described above, the FET1A's drain voltage, the FET2A's source voltage (voltage at the first node N1) become equal to the reference voltage Vref and to the FET1B's drain voltage (voltage at the second node N2). Accordingly, a current n×Ib1 in accordance with the mirror ratio of 1:n is accurately supplied as a supply current Id1 of the high-frequency LNA 1. The cascode amplifier circuit 10 receives a high-frequency input signal at the RFin terminal and then outputs an amplified high-frequency input signal from the RFout terminal.

The operation of the high-frequency LNA 1 halts when the enable signal EN is turned to be logic low. Accordingly, the PMOS1 is turned off and the power supply circuit 30 is shut down. Conversely, the NMOS1 is turned on to connect the power supply node Ndd to the ground GND to discharge residual electric charges at the power supply node Ndd.

Figure 3A:
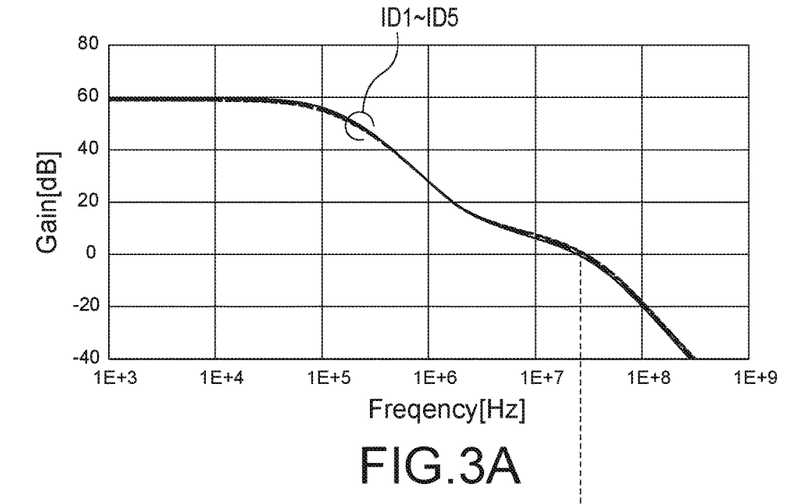
FIGS. 3A and 3B are Bode plots of a high-frequency LNA 1 according to the first embodiment.
Figure 3B:
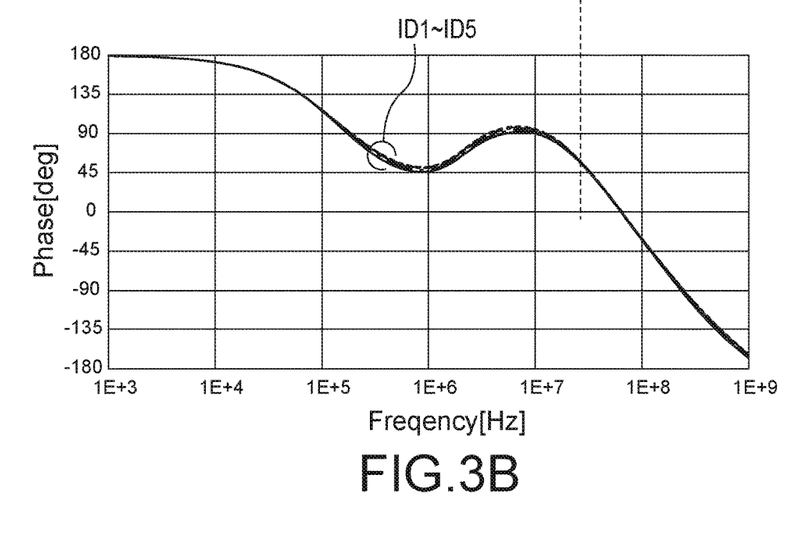

FIGS. 3A and 3B are Bode plots of the high-frequency LNA 1 according to the first embodiment. FIG. 3A shows loop gain versus frequency characteristics of the AMP1, the stabilizing circuit 21, the FET1B, and the first variable current source CS1. FIG. 3B shows phase versus frequency characteristics of the AMP1, the stabilizing circuit 21, the FET1B, and the first variable current source CSI. Signs ID1 to ID5 indicate a result of change in value of the current Ib (Ib=Ib1=Ib2) set by the first and second variable current sources CS1 and CS2, the current Ib being increased in ascending order from ID1 to ID5.

In theory, when the phase characteristics are exhibited below zero degrees in a gain-characteristics range of 0 dB or higher, the loop of the AMP1, the stabilizing circuit1, the FET1B, and the first variable current source CS1 enters an oscillation state, uncontrollable. Practically, even if the phase characteristics are exhibited above zero degrees, shift in operating point, oscillation due to variation in production, etc. may occur. It is therefore common to design a high-frequency LNA to secure a phase of 45 degrees or higher. A margin to zero degrees is referred to as a phase margin. A phase margin of 45 degrees or lower causes ringing with attenuation, although not oscillation, to the bias generating circuit having the loop of the AMP1, the stabilizing circuit1, the FET1B and the first variable current source CS1, and the high-frequency LNA 1. Moreover, a drastic change, such as a peak, in the gain characteristics tends to cause oscillation to the high-frequency LNA 1 and the bias generating circuit.

In the high-frequency LNA 1 according to the present embodiment, as shown in FIG. 3A, the gain characteristics exhibit moderate decrease with increase in frequency, with no peaks, at any current values of ID1 to ID5. The phase characteristics exhibit, as shown in FIG. 3B, gradual transition from 180 degrees, keeping 45 degrees or higher even at 0 dB or lower in the gain characteristics. In summary, according to the present embodiment, the phase margin is secured in the frequency range at 0 dB or higher in the gain characteristics, with rare occurrence of oscillation and ringing. Moreover, as shown in FIGS. 3A and 3B, at any of ID1 to ID5, the gain and phase each exhibit almost the same characteristics, with no big difference. In other words, the high-frequency LNA 1 according to the present embodiment is almost stable even though the current Ib value is switched (varied). Accordingly, the gain control function is achieved by varying the current Ib while the high-frequency LNA 1 is kept stable. Moreover, the characteristics of the high-frequency LNA 1 can be adjusted by varying the current Ib while the high-frequency LNA 1 is kept stable, even if there are element variance in the high-frequency LNA, impedance mismatching, noise mismatching, etc.

Figure 4A:
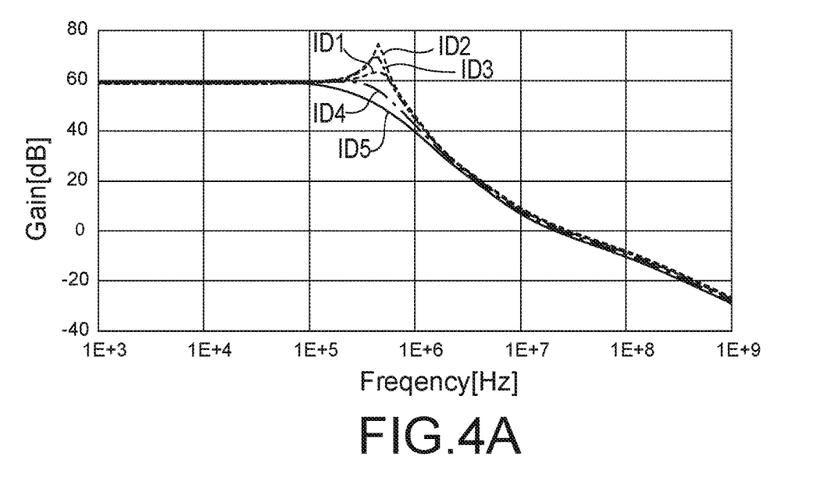
FIGS. 4A and 4B are Bode plots of a high-frequency LNA without having the first and second stabilizing circuits 21 and 22.
Figure 4B:
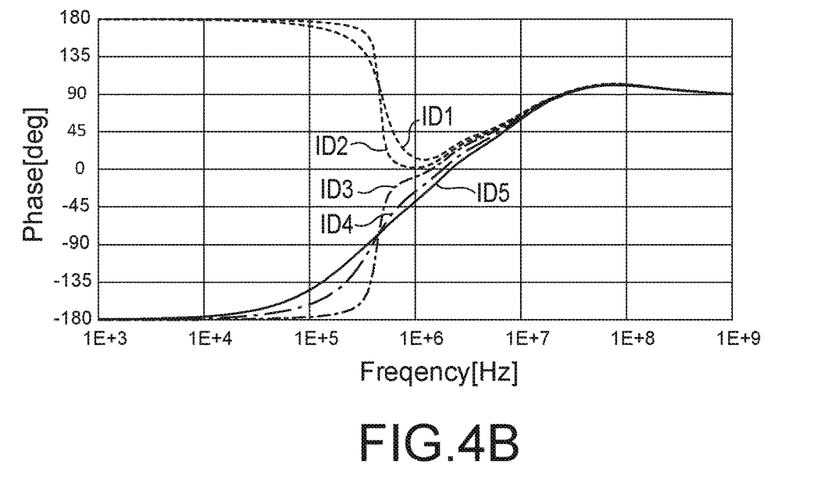

For example, if the first and second stabilizing circuits 21 and 22 are not provided, a high-frequency LNA exhibits the characteristics such as shown in FIGS. 4A and 4B. FIGS. 4A and 4B are Bode plots of a high-frequency LNA without having the first and second stabilizing circuits 21 and 22.

As shown in FIG. 4A, without having the first and second stabilizing circuits 21 and 22, there are peaks in the gain characteristics at ID1 to ID3, except at ID4 and ID5, which could cause oscillation. The phase characteristics exhibit, as shown in FIG. 4B, a drastic change from 180 degrees to zero degrees especially at high gain characteristics, in the frequency range from 100 kHz to 1 MHz (1E5 Hz to 1E6 Hz), with high possibility of oscillation or ringing, resulting in an unstable high-frequency LNA. Moreover, as shown in FIGS. 4A and 4B, the gain and phase each exhibit characteristics largely different at ID1 to ID5. Accordingly, a high-frequency LNA without having the first and second stabilizing circuits 21 and 22 cannot be kept stable if the current Ib is varied even if the elements in the high-frequency LNA are adjusted to be stable at a certain current Ib value.

On the contrary, according to the present embodiment, having the first and second stabilizing circuits 21 and 22 provided, the gain characteristics exhibit moderate change with no peaks. Moreover, the first and second stabilizing circuits 21 and 22 serve to separate pole positions on the phase characteristics and advance (boost) the phase. For example, the phase characteristics shown in FIG. 4B exhibit sudden delay of about 180 degrees before 1 MHz (1E6 Hz). On the other hand, the phase characteristics shown in FIG. 3B exhibit delay of 45 degrees from 180 degrees to 135 degrees before 100 kHz (1E5 Hz) and moderate advancement of 135 degrees to 45 degrees from 100 kHz to 1 MHz. This is because the first and second stabilizing circuits 21 and 22 widen a gap between poles next to one another (gap between frequencies) to separate the poles. Moreover, the first and second stabilizing circuits 21 and 22 return (advance) the phase from 45 degrees to 90 degrees in the phase characteristics from 1 MHz to 10 MHz (1E6 Hz to 1E7 Hz). As described above, the phase margin is secured in the frequency range at 0 dB or higher in the gain characteristics, with rare occurrence of oscillation and ringing.

Moreover, as shown in FIGS. 3A and 3B, at any of ID1 to ID5, the gain and phase each exhibit almost the same characteristics, with no big difference. Therefore, the high-frequency LNA 1 can be kept stable even though the current Ib (Ib=Ib1=Ib2) is varied.

As described above, the high-frequency LNA 1 according to the present embodiment is a stable high-frequency amplifier circuit having a unique bias generating circuit that is kept stable with almost no oscillation, even though the current Ib (Ib=Ib1=Ib2) is varied. Moreover, according to the present embodiment, a negative feedback circuit of the AMP1 and AMP2 can supply a set current Id1 (Id1=n×Ib1) to the cascode amplifier circuit 10, at a correct current mirror ratio achieved by appropriately biasing the first node N1. Accordingly, the high-frequency LNA 1 formed on an SOI substrate becomes an amplifier circuit that is stable and current settable as required.

Second Embodiment

Figure 5:
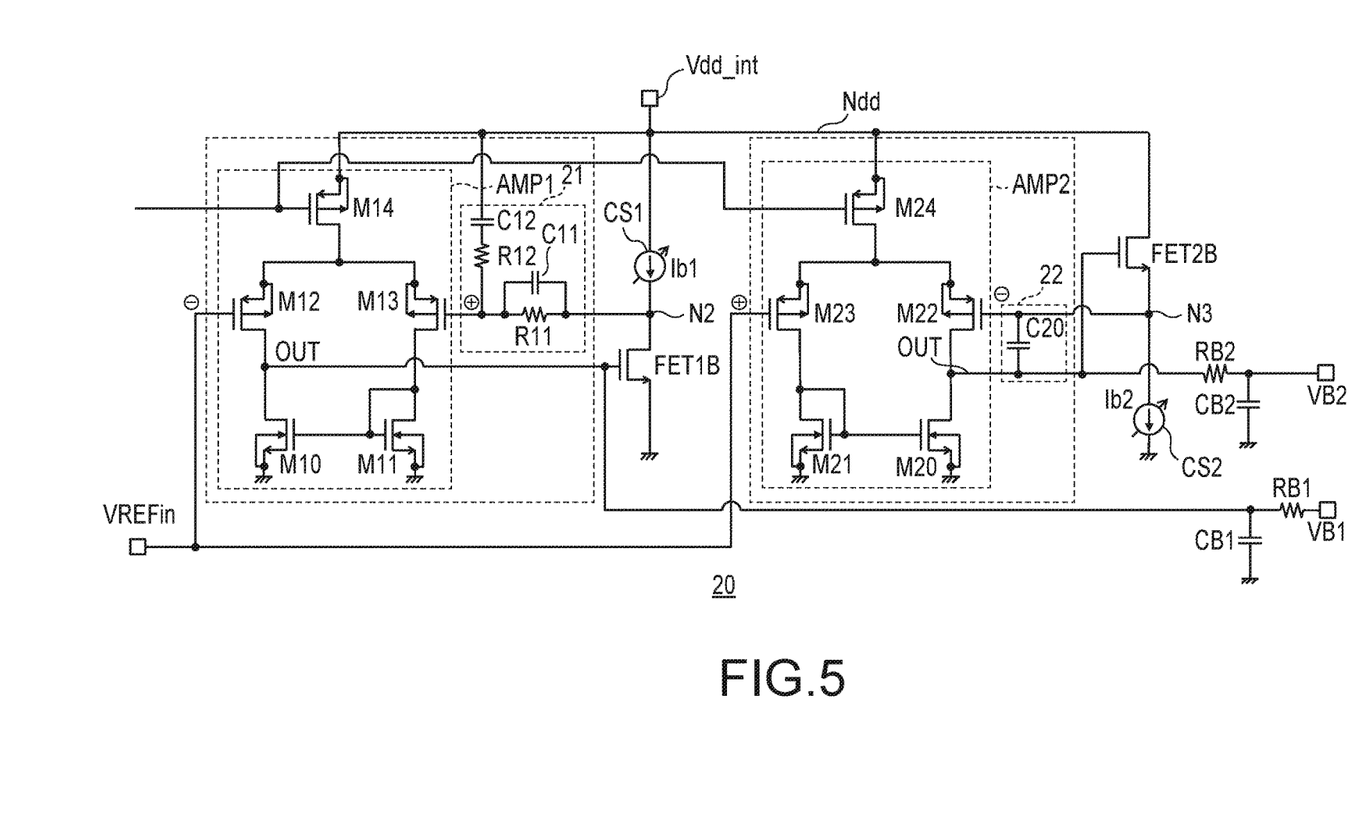
FIG. 5 is a block diagram showing an example of the configuration of a bias generating circuit 20 according to a second embodiment.

FIG. 5 is a block diagram showing an example of the configuration of a bias generating circuit 20 according to a second embodiment. In the second embodiment, the first stabilizing circuit 21 has a different configuration from the counterpart of the first embodiment. The other configurations of the second embodiment may be the same as the corresponding configurations of the first embodiment.

The first stabilizing circuit 21 of the second embodiment is connected between the second node N2 and the AMP1 non-inverting input. The first stabilizing circuit 21 is provided with first and second resistors R11 and R12, and first and second capacitors C11 and C12. The first resistor R11 and the first capacitor C11 are connected in parallel between the AMP1 non-inverting input and the second node N2. The second resistor R12 and the second capacitor C12 are connected in series between the AMP1 non-inverting input and the power-supply node Ndd.

The first resistor R11 and the first capacitor C11 return (advance) the phase from about 45 degrees to about 90 degrees in the phase characteristics from 1 MHz to 10 MHz shown in FIG. 3B. The second resistor R12 and the second capacitor C12, as described above, widen a gap between poles next to one another (gap between frequencies) to separate the poles. In this way, the phase characteristics exhibit moderate change in 10 kHz to 1 MHz, as shown in FIG. 3B.

As described above, the second embodiment is achieved to exhibit almost the same gain and frequency characteristics as the first embodiment. Therefore, the second embodiment exhibits the same effect as the first embodiment.

Third Embodiment

Figure 6:
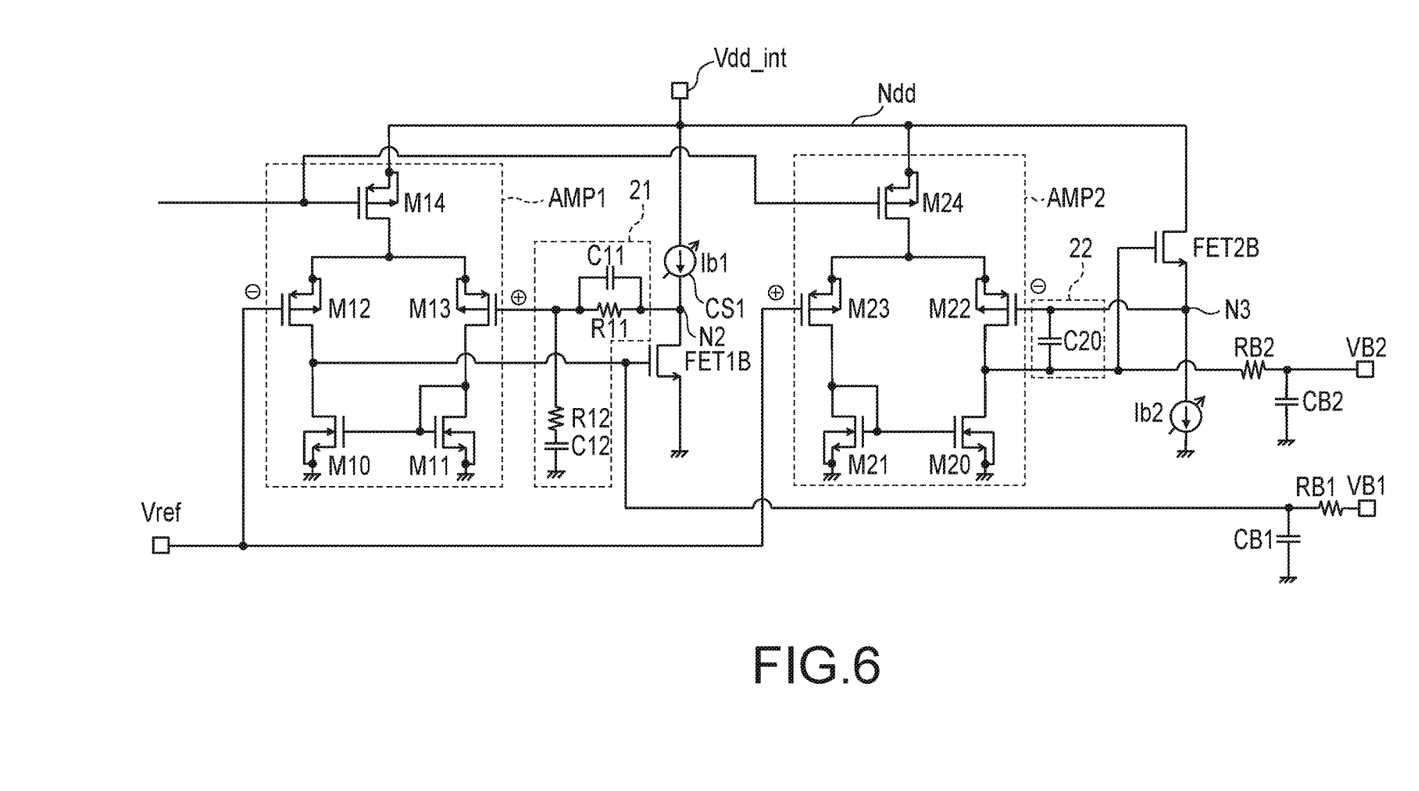
FIG. 6 is a block diagram showing an example of the configuration of a bias generating circuit 20 according to a third embodiment.

FIG. 6 is a block diagram showing an example of the configuration of a bias generating circuit 20 according to a third embodiment. In the third embodiment, the second resistor R12 and the second capacitor C12 of the first stabilizing circuit 21 are connected in series between the AMP1 non-inverting input and the ground GND. The other configurations of the third embodiment may be the same as the corresponding configurations of the second embodiment.

The second resistor R12 and the second capacitor C12 of the third embodiment serve to function in the same manner as the counterparts of the second embodiment in widening a gap between poles next to one another (gap between frequencies) to separate the poles. Therefore, the third embodiment is achieved to exhibit almost the same gain and frequency characteristics as the second embodiment. Accordingly, the third embodiment exhibits the same effect as the second embodiment.

Fourth Embodiment

Figure 7:
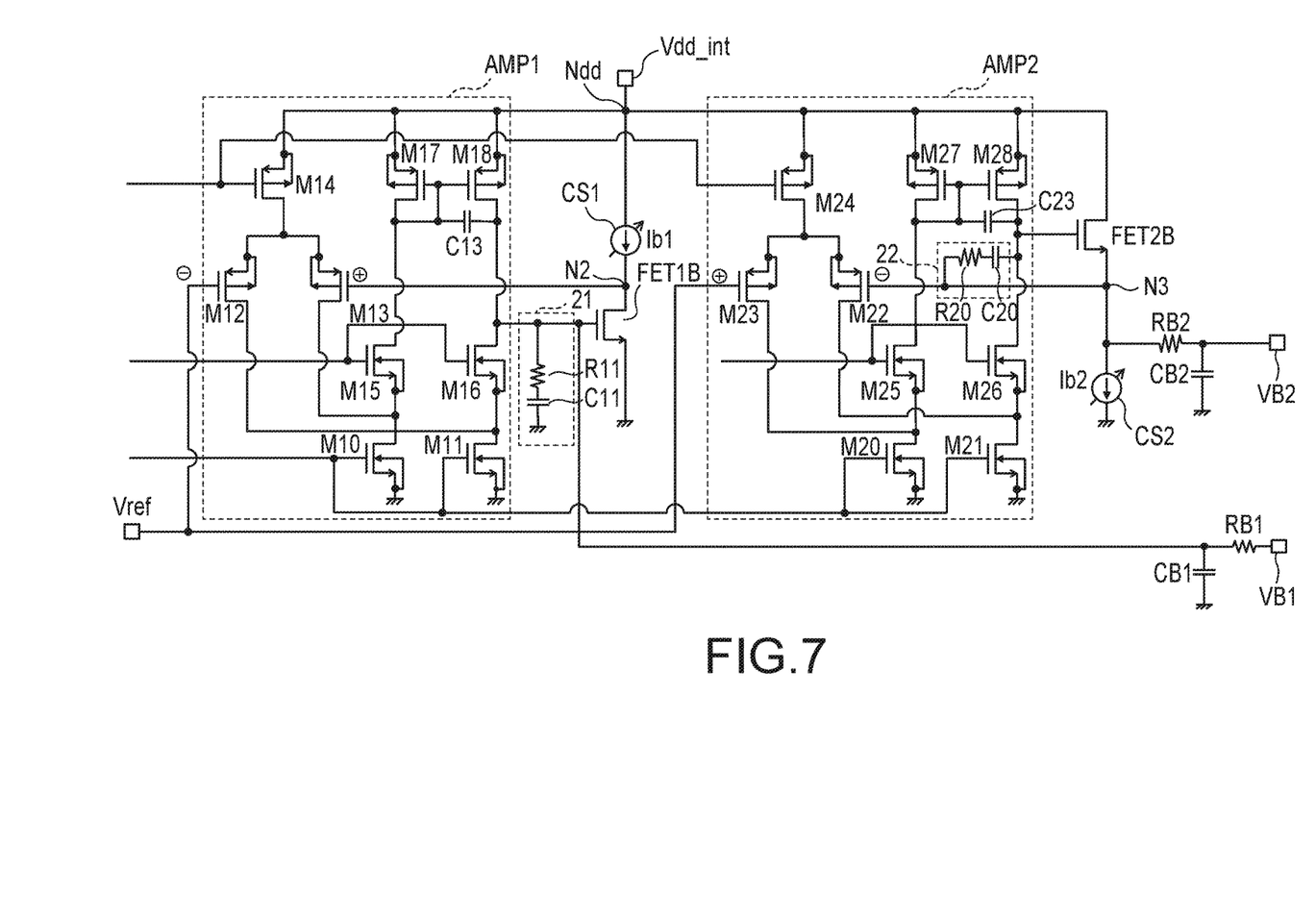
FIG. 7 is a block diagram showing an example of the configuration of a bias generating circuit 20 according to a fourth embodiment.

FIG. 7 is a block diagram showing an example of the configuration of a bias generating circuit 20 according to a fourth embodiment. In the fourth embodiment, the first and second operational amplifier circuits AMP1 and AMP2 have different configurations from the counterparts of the first embodiment. The other configurations of the fourth embodiment may be the same as the corresponding configurations of the first embodiment.

Besides the M10 to M14, the AMP1 is provided with NMOS transistors M15 and M16, PMOS transistors M17 and M18, and a capacitor C13.

The M15 is connected between the M10 and M17. The M16 is connected between the M11 and M18. Gates of the M15 and M16 are connected in a common-gate structure. The M17 is connected between the power-supply node Ndd and the M15. The M18 is connected between the power-supply node Ndd and the M16. Gates of the M17 and M18 are both connected to a drain of the M15. The capacitor C13 is connected between the gates of the M17 and M18, and a drain of the M16. As described above, the AMP1 is a so-called folded-cascode operational amplifier.

Besides the M20 to M24, the AMP2 is provided with NMOS transistors M25 and M26, PMOS transistors M27 and M28, and a capacitor C23.

The M25 is connected between the M20 and M27. The M26 is connected between the M21 and M28. Gates of the M25 and M26 are connected in a common-gate structure. The M27 is connected between the power-supply node Ndd and the M25. The M28 is connected between the power-supply node Ndd and the M26. Gates of the M27 and M28 are both connected to a drain of the M25. The capacitor C23 is connected between the gates of the M27 and M28, and a drain of the M26. As described above, the AMP2 is also a so-called folded-cascode operational amplifier circuit.

To the M10, M11, M20 and M21, the same bias voltage is supplied. The M10 and M11 function as a current mirror circuit. The M20 and M21 also function as a current mirror circuit. To the M15, M16, M25 and M26, the same bias voltage is supplied. Therefore, the M15 and M16 function as a cascode circuit. The M25 and M26 also function as a cascode circuit.

The first stabilizing circuit 21 may have the same configuration as the stabilizing circuit 21 of the first embodiment. Thus, the first stabilizing circuit 21 has a resistor R11 and a capacitor C11 connected in series between the gate of the FET1B and the ground GND. The second stabilizing circuit 22 may basically have the same configuration as the stabilizing circuit 22 of the first embodiment, except for a resistor R20 added between the capacitor C20 and the node N3. The resistor R20 is added to secure the phase margin for further stability, because of a higher gain of the AMP2 in the fourth embodiment than the AMP2 in the first embodiment.

As described above, the AMP1 and AMP2 are both a so-called folded-cascode operational amplifier circuit. Therefore, higher gain characteristics can be achieved with the frequency characteristics of the first embodiment maintained, for example. Accordingly, a lower offset voltage is achieved between the second-node voltage N2 and the reference voltage Vref, and also between the third-node voltage N3 and the reference voltage Vref, generating accurate bias voltages VB1 and VB2, respectively. Moreover, the fourth embodiment exhibits the same effects as the first embodiment.

Fifth Embodiment

Figure 8:
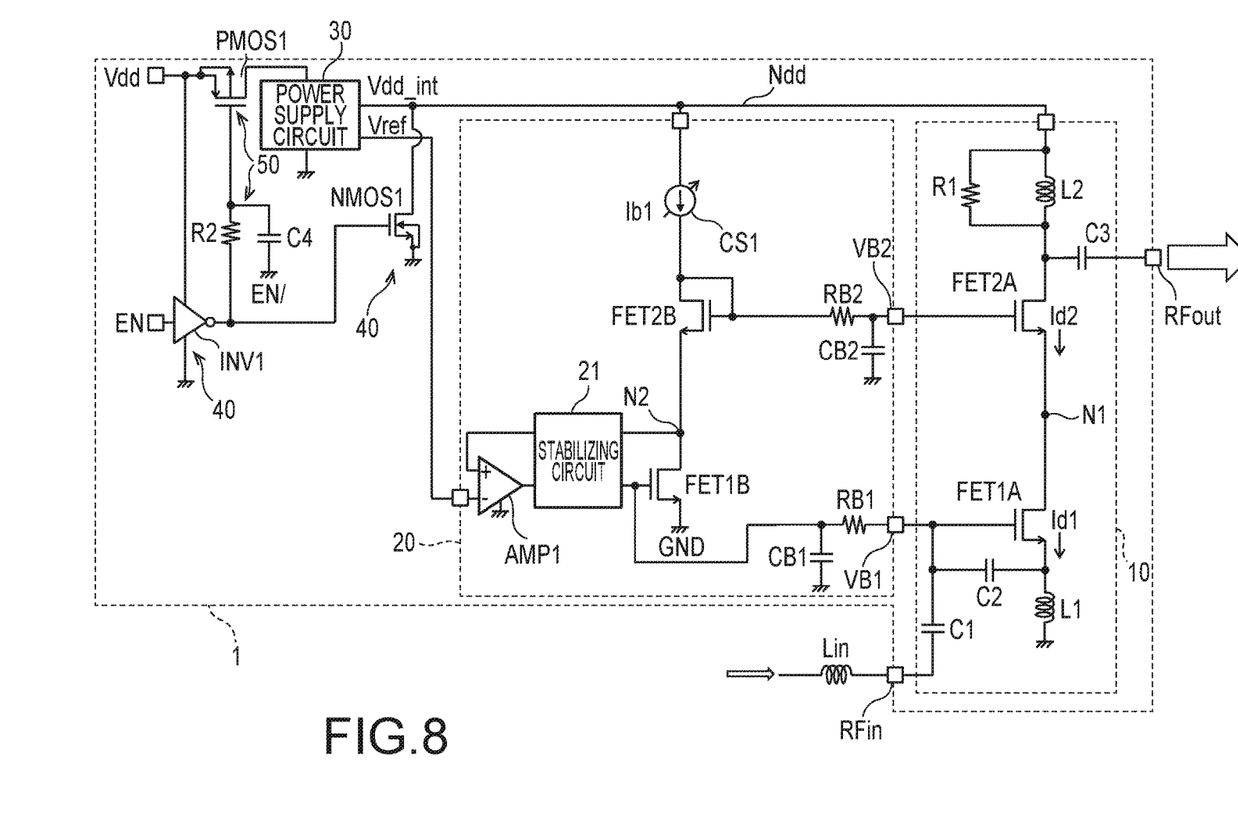
FIG. 8 is a block diagram showing an example of the configuration of a high-frequency LNA according to a fifth embodiment.

FIG. 8 is a block diagram showing an example of the configuration of a high-frequency LNA according to a fifth embodiment. In the fifth embodiment, the bias generating circuit 20 is different from the counterpart of the first embodiment. The other configurations of the fifth embodiment may be the same as the corresponding configurations of the first embodiment.

The bias generating circuit 20 is provided with a first variable current source CS1, an N-type transistor (third transistor) FET1B, a first operational amplifier circuit AMP1, a first stabilizing circuit 21, capacitors CB1 and CB2, and resistors RB1 and RB2. The FET1B and FET2B share the first variable current source CS1, with the second variable current source CS2, the second stabilizing circuit 22, and the second operational amplifier circuit AMP2 being not provided.

The FET1B and FET2B are connected in series between the first variable current source CS1 and the ground GND. In detail, a source of the FET1B is connected to the ground GND, a drain thereof being connected to a source of the FET2B. A drain of the FET2B is connected to the first variable current source CS1.

A gate of the FET1B is connected to the output of the operational amplifier circuit AMP1 via the stabilizing circuit 21 and also connected to a gate of the FET1A via the resistor RB1. The gates of the FET1B and FET1A are connected in a common-gate structure, so that the FET1B and FET1A constitute a current mirror circuit. The FET1B is under control by the operational amplifier circuit AMP1 to be supplied with a current Ib1 from the first variable current source CS1. When the current Ib1 is supplied, a gate voltage of the FET1B is generated as a bias voltage VB1 and applied to the gate of the FET1A. To the FET1A, the bias voltage VB1 is supplied as a gate voltage, so that the FET1A feeds a current Id1. For example, when the FET1A's size is n times the FET1B's size, the FET1A can feed a current n times the current of the FET1B, so that the current Id1 becomes almost equal to n×Ib1. As described above, the FET1B functions as a replica of the FET1A.

A gate of the FET2B is connected to a gate of the FET2A via the resistor RB2, so that the gates of the FET1B and FET1A are connected in a common-gate structure. The FET2B is not provided with a negative-feedback circuit using the operational amplifier circuit AMP2. The current Ib1 flows through the FET2B, in the same way as the FET1B. When the current Ib1 flows, a gate voltage of the FET2B is generated as a bias voltage VB2 and applied to the gate of the FET2A. The FET2A is supplied with the bias voltage VB2 as the gate voltage to feed a current Id2. For example, when the FET2A's size is n times the FET2B's size, the current flowing through the FET2A is n time the current flowing through the FET2B, as Id2=Id1=Ib1× n=Ib2×n, resulting in that the FET2B's gate-to-source voltage Vgs2B and the FET2A's gate-to-source voltage Vgs2A become almost equal to each other. As described above, the FET2B functions as a replica of the FET2A.

The AMP1 controls the FET1B's gate voltage (bias voltage VB1) so that the FET1B's drain voltage (voltage at the second node N2), which is generated when the current Ib1 flows, becomes almost equal to the reference voltage Vref supplied from the power supply circuit 30, as a reference.

The first stabilizing circuit 21, which is the first characteristics changing circuit, is connected between the AMP1 and the gate or drain (second node N2) of the FET1B. The first stabilizing circuit 21 changes at least one of the loop gain characteristics and phase characteristics of a loop from the AMP1, through a circuit constituted by the first variable current source CS1 and the FET2B, to the FET1B. The internal configuration of the stabilizing circuit 21 may be the same as the counterpart of any of the first to fourth embodiments.

The other configuration of the bias generating circuit 20 of the fifth embodiment may be the same as the bias generating circuit 20 of the first embodiment.

Subsequently, the operation of the high-frequency LNA 1 according to the fifth embodiment will be explained.

The bias voltage VB1 is generated in the same manner as in the first embodiment. Therefore, the current Ibi flows to the second node N2, so that a voltage at the second node N2 becomes almost equal to the reference voltage Vref, during which the AMP1 controls the gate voltage (bias voltage VB1) of the FET1B so that the source-to-drain voltage of the FET1B becomes equal to the reference voltage Vref.

The source voltage of the FET2B is almost equal to the reference voltage Vref. The FET2B feeds the bias current Ib1 to generate a gate-to-source voltage Vgs2B, resulting in Vref+Vgs2B being applied to the gate of the FET2A as a bias voltage VB2.

Since the gates of the FET2A and FET2B are connected in a common-gate structure, a current Id2 (Id2=Id1=n×Ib1) decided by the FET1A flows through the FET2A. By adjusting the FET2A's size to be n times the FET2B's size, the FET2A's gate-to-source voltage Vgs2A becomes almost equal to the FET2B's gate-to-source voltage Vgs2B. Therefore, the FET2A's source voltage (voltage at the first node N1) is Vref+Vgs2B−Vgs2A, becoming almost equal to the reference voltage Vref, together with the FET2B's source voltage Vs2B. Namely, the FET2A and FET2B set the voltage at the first node N1 to the reference voltage Vref.

As described above, the FET1A's drain voltage, the FET2A's source voltage (voltage at the first node N1) become equal to the reference voltage Vref and to the FET1B's drain voltage (voltage at the second node N2). Accordingly, a current n×Ib in accordance with the mirror ratio of 1:n is accurately supplied as supply currents Id1 and Id2 of the high-frequency LNA 1.

According to the fifth embodiment, the FET1B and FET2B are connected in series and share the variable current source. This type of high-frequency LNA 1 can also supply the bias voltages VB1 and VB2 stable against the change in the current Ib1 and maintain the current mirror ratio accurately. In other words, the fifth embodiment exhibits the same effect as the first embodiment.

Moreover, the high-frequency LNA 1 according to the fifth embodiment has a simple configuration, because of omission of the AMP2 and the stabilizing circuit 22. In another aspect, the high-frequency LNA 1 according to the fifth embodiment is effective at a relatively high internal power-supply voltage Vdd_int. For example, in the fifth embodiment, the required minimum internal power-supply voltage Vdd_int is the sum of the voltage Vref at the second node N2, the FET2B's gate-to-source voltage Vgs2B, and the voltage Vcs1 applied to the variable current source CS1. Therefore, if Vref=0.8V, Vgs2B=0.7V, and Vcs1=0.2V, the internal power-supply voltage Vdd_int requires 1.7V or higher. On the other hand, in the first embodiment, the sum of the voltage Vref at the second node N2 and the voltage Vcs1 applied to the variable current source CS1 is enough for the internal power-supply voltage Vdd_int. Therefore, if Vref=0.8V and Vcs1=0.2V, it is enough for the internal power-supply voltage Vdd_int to be 1.0V. Accordingly, the fifth embodiment can be used if a high power supply voltage can be supplied whereas the first to fourth embodiments can be used if a low power supply voltage can only be supplied.

Since the fifth embodiment can be used if a high power supply voltage can be supplied, the high-frequency LNA 1 can be kept stable with a smaller circuit scale.

Sixth Embodiment

Figure 9:
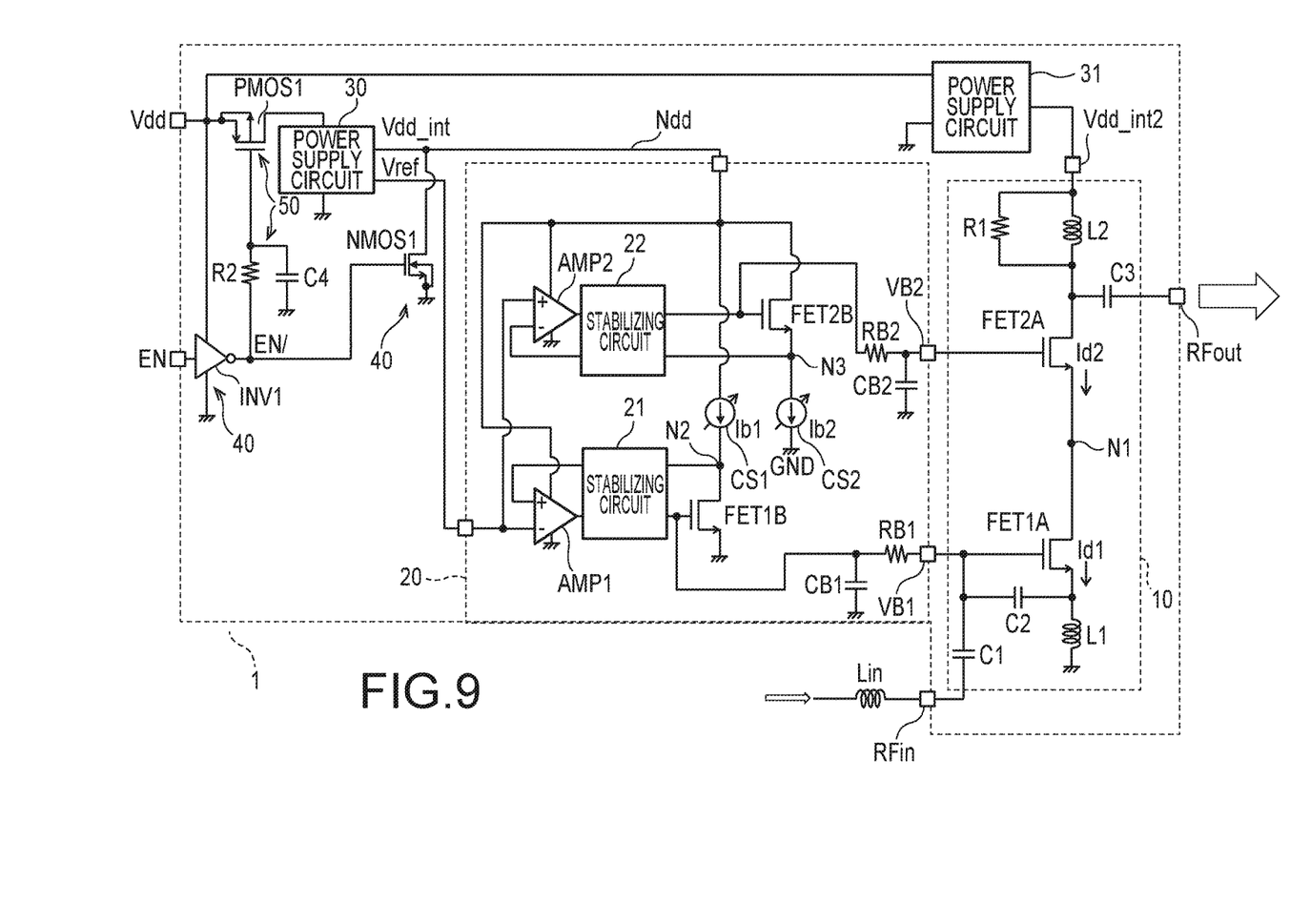
FIG. 9 is a block diagram showing an example of the configuration of a high-frequency LNA according to a sixth embodiment.

FIG. 9 is a block diagram showing an example of the configuration of a high-frequency LNA according to a sixth embodiment. The high-frequency LNA according to the sixth embodiment is provided further with a second power supply circuit 31, different from the first embodiment. The second power supply circuit 31 generates a second internal power-supply voltage Vdd_int2, different from the internal power-supply voltage Vdd_int, from the external power-supply voltage Vdd. The second power supply circuit 31 supplies the second internal power-supply voltage Vdd_int2 to the cascode amplifier circuit 10. The other configurations of the sixth embodiment may be the same as the corresponding configurations of the first embodiment. As described above, even though the internal power-supply voltage is different between the cascode amplifier circuit 10 and the bias generating circuit 20, the effect of the present embodiment cannot be lost. Moreover, the sixth embodiment can be applied to any of the second to fifth embodiments.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A high-frequency semiconductor amplifier circuit comprising:
    an amplifier circuit formed on an SOI (Silicon On Insulator) substrate, the amplifier circuit including a first transistor and a second transistor, the first transistor connected between a ground voltage source and a first node, a gate of the first transistor connected to a high-frequency input terminal, the second transistor connected between the first node and a high-frequency output terminal;
    a bias generating circuit formed on the SOI substrate, the bias generating circuit connected to the gate of the first transistor and to a gate of the second transistor; and
    a power supply circuit formed on the SOI substrate, the power supply circuit supplying a power supply voltage to the amplifier circuit and the bias generating circuit, wherein
    the bias generating circuit comprises:
    a first variable current source to be supplied with the power supply voltage;
    a third transistor connected between the first variable current source and the ground voltage source, a gate of the third transistor connected to the gate of the first transistor;
    a first operational amplifier controlling a gate voltage of the third transistor so that a voltage at a second node becomes almost equal to a reference voltage, the second node located between the first variable current source and the third transistor; and
    a first characteristics changing circuit connected to the gate of the third transistor or the second node, the first characteristics changing circuit changing at least one of loop gain characteristics and phase characteristics of a loop from the first operational amplifier circuit, through the third transistor, to the first variable current source.

2. The circuit according to claim 1, wherein the first characteristics changing circuit includes a first resistor and a first capacitor,
    wherein the first resistor and the first capacitor are connected in series between the gate of the third transistor and the ground voltage source.

3. The circuit according to claim 1, wherein the bias generating circuit comprises:
    a second variable current source connected to the ground voltage source;
    a fourth transistor connected between the power supply circuit and the second variable current source, a gate of the fourth transistor connected to the gate of the second transistor;
    a second operational amplifier controlling a gate voltage of the fourth transistor so that a voltage at a third node becomes almost equal to the reference voltage, the third node located between the second variable current source and the fourth transistor; and
    a second characteristics changing circuit connected to the gate of the fourth transistor or the third node, the second characteristics changing circuit changing at least one of loop gain characteristics and phase characteristics of a loop from the second operational amplifier, through the fourth transistor, to the second variable current source.

4. The circuit according to claim 2, wherein the bias generating circuit comprises:
    a second variable current source connected to the ground voltage source;
    a fourth transistor connected between the power supply circuit and the second variable current source, a gate of the fourth transistor connected to the gate of the second transistor;
    a second operational amplifier controlling a gate voltage of the fourth transistor so that a voltage at a third node becomes almost equal to the reference voltage, the third node being located between the second variable current source and the fourth transistor; and
    a second characteristics changing circuit connected to the gate of the fourth transistor or the third node, the second characteristics changing circuit changing at least one of loop gain characteristics and phase characteristics of a loop from the second operational amplifier, through the fourth transistor, to the second variable current source.

5. The circuit according to claim 3, wherein the second characteristics changing circuit includes a second capacitor,
    wherein the second capacitor is connected between the gate of the fourth transistor and the third node.

6. The circuit according to claim 4, wherein the second characteristics changing circuit includes a second capacitor,
    wherein the second capacitor is connected between the gate of the fourth transistor and the third node.

7. The circuit according to claim 1, wherein the first characteristics changing circuit includes a first resistor and a first capacitor,
    wherein the first resistor and the first capacitor are connected in parallel between an input of the first operational amplifier and the second node.

8. The circuit according to claim 1, wherein the first characteristics changing circuit includes a second resistor and a second capacitor connected in series between an input of the first operational amplifier and the power supply circuit or the ground voltage source.

9. The circuit according to claim 7, wherein the first characteristics changing circuit includes a second resistor and a second capacitor connected in series between an input of the first operational amplifier and the power supply circuit or the ground voltage source.

10. The circuit according to claim 3, wherein the second characteristics changing circuit includes a second resistor and a second capacitor connected in series between the gate of the fourth transistor and the third node.

11. The circuit according to claim 4, wherein the second characteristics changing circuit includes a second resistor and a second capacitor connected in series between the gate of the fourth transistor and the third node.

12. The circuit according to claim 1 further comprising a fourth transistor connected between the first variable current source and the second node, a gate of the fourth transistor connected to the first variable current source.

13. The circuit according to claim 2 further comprising a fourth transistor connected between the first variable current source and the second node, a gate of the fourth transistor connected to the first variable current source.

14. The circuit according to claim 1, wherein the power supply circuit supplies different supply voltages to the amplifier and the bias generating circuit.

15. The circuit according to claim 2, wherein the power supply circuit supplies different supply voltages to the amplifier and the bias generating circuit.

* * * * *